US008446204B2

(12) United States Patent
Srivastava et al.

(10) Patent No.: US 8,446,204 B2
(45) Date of Patent: May 21, 2013

(54) HIGH VOLTAGE TOLERANT RECEIVER

(75) Inventors: Ankit Srivastava, San Diego, CA (US); Xuhao Huang, San Diego, CA (US); Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 13/014,740

(22) Filed: Jan. 27, 2011

(65) Prior Publication Data

US 2012/0194254 A1 Aug. 2, 2012

(51) Int. Cl.
*H03L 5/00* (2006.01)
*H03K 3/00* (2006.01)

(52) U.S. Cl.
USPC .......................................... 327/333; 327/205

(58) Field of Classification Search
USPC .................................. 327/205, 333
See application file for complete search history.

(56) References Cited

U.S. PATENT DOCUMENTS

| | | | |
|---|---|---|---|
| 5,319,259 A | 6/1994 | Merrill | |
| 5,336,942 A | 8/1994 | Khayat | |
| 5,541,534 A | 7/1996 | Cao et al. | |
| 6,342,996 B1 * | 1/2002 | Drapkin et al. | 361/91.1 |
| 6,362,653 B1 | 3/2002 | Coughlin, Jr. et al. | |
| 6,377,105 B1 | 4/2002 | Hughes | |
| 6,501,383 B1 * | 12/2002 | Haupenthal | 340/578 |
| 6,759,692 B1 | 7/2004 | Ochi | |
| 6,801,060 B2 | 10/2004 | Ikehashi et al. | |
| 6,930,530 B1 | 8/2005 | Wang | |
| 7,164,305 B2 * | 1/2007 | Gupta et al. | 327/333 |
| 7,382,159 B1 * | 6/2008 | Baker | 326/83 |
| 7,453,299 B1 | 11/2008 | Bui | |
| 7,457,090 B2 | 11/2008 | Randazzo | |
| 7,557,633 B2 | 7/2009 | Yu | |
| 7,660,090 B1 * | 2/2010 | Daugherty | 361/91.1 |
| 7,868,690 B2 | 1/2011 | Ganz | |
| 7,884,646 B1 | 2/2011 | Bourstein | |
| 7,969,218 B2 | 6/2011 | Lee | |
| 2003/0071673 A1 | 4/2003 | Jordanger et al. | |
| 2006/0044023 A1 | 3/2006 | Yun et al. | |
| 2010/0026362 A1 | 2/2010 | Shankar et al. | |
| 2010/0085080 A1 | 4/2010 | Nedalgi | |
| 2012/0194253 A1 | 8/2012 | Srivastava et al. | |

OTHER PUBLICATIONS

International Search Report and Written Opinion—PCT/US2012/022968—ISA/EPO—Jul. 12, 2012.

* cited by examiner

*Primary Examiner* — Ryan Jager
(74) *Attorney, Agent, or Firm* — Sam Talpalatsky; Nicholas J. Pauley; Joseph Agusta

(57) ABSTRACT

A high voltage tolerant single ended receiver circuit includes a voltage divider that is operative to divide in half single ended input signals that are greater than the threshold voltages of the voltage divider. A pass gate circuit is operative to receive single ended signals that are below the threshold voltages of the voltage divider. Output from the voltage divider is coupled to a first input of a modified Schmitt trigger circuit to control a high threshold level of the Schmitt trigger circuit. Output from the pass gate circuit is coupled to a second input of the modified Schmitt trigger circuit to control a low threshold level of the Schmitt trigger circuit.

19 Claims, 11 Drawing Sheets

HIGH VOLTAGE TOLERANT RECEIVER

CROSS REFERENCE TO RELATED APPLICATION

This application is related to U.S. patent application Ser. No. 13/014,738, entitled "HIGH VOLTAGE TOLERANT DIFFERENTIAL RECEIVER" filed on Jan. 27, 2011.

FIELD

The present disclosure relates to analog circuit design and more particularly to circuits for processing input signals received in a high voltage domain by circuit components operating in a low voltage domain.

BACKGROUND

As the scale of integrated circuit designs is increasingly reduced, power supply voltages to the integrated circuits are also reduced. However, the integrated circuit designs receive signals at higher voltage levels even though the internal power available for the circuit designs may be reduced below the voltage level of certain received signals.

For example, an on-chip supply voltage of an integrated circuit design may be in a range of about 1.8 volts. Receiver circuitry on the chip may be required to handle high voltage domain I/O signals in a range of 0V to 3.6 V. The high voltage domain I/O signals would saturate amplifiers of the receiver circuitry if the high voltage domain signals were directly connected to the chip. Thus, a receiver circuit operating in the 1.8 V domain could not reliably receive a directly connected signal above a common mode of 1.8 volts. Complex circuit designs involving source followers, voltage regulators, level selection logic, etc., have been required to interface the high voltage domain I/O signals with low voltage domain receiver circuit designs.

Certain circuit designs such as those compatible with USB 2.0, have both differential receivers and single ended receivers. In these circuit designs, the differential receivers are handled separately from the single ended receivers. A large amount of area on a chip is consumed to facilitate handling of both receiver types.

SUMMARY

Aspects of the present disclosure include circuit designs for handling high voltage domain I/O signals by low voltage domain circuit elements. Further aspects of the present disclosure include interface circuitry that may be shared between differential receivers and single ended receivers.

One aspect of the present disclosure includes a transistor ladder voltage divider that is operative to divide in half differential input signals that are greater than threshold voltages of the transistor ladder. A pass gate circuit is operative to receive differential input signals that are below the threshold voltages of the transistor ladder. Outputs from the transistor ladder voltage divider and the pass gate circuit are provided to separate comparators. Output from the comparators are combined to generate a signal in the voltage domain of receiver circuitry.

Another aspect of the present disclosure includes a transistor voltage divider that is operative to divide in half single ended input signals that are greater than the threshold voltages of the transistor voltage divider. A pass gate circuit is operative to receive single ended signals that are below the threshold voltages of the transistor voltage divider. Output from the transistor voltage divider is coupled to a first input of a modified Schmitt trigger circuit to control a high threshold level of the Schmitt trigger circuit. Output from the pass gate circuit is coupled to a second input of the modified Schmitt trigger circuit to control a low threshold level of the Schmitt trigger circuit.

DETAILED DESCRIPTION

Figure 1:
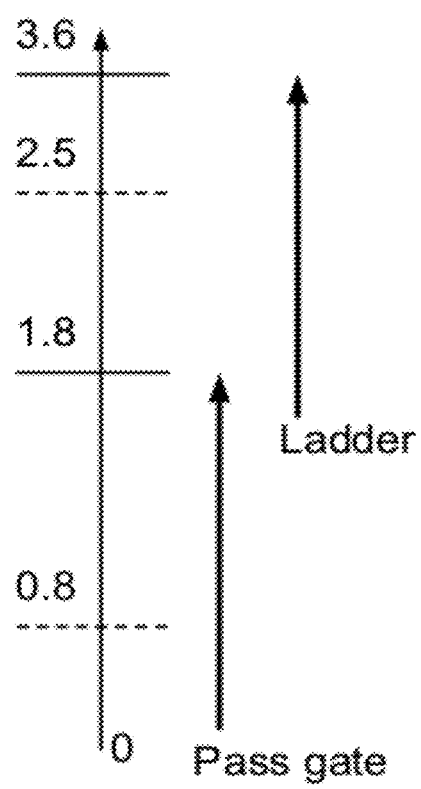
FIG. 1 is a diagram of input output (I/O) signal voltage levels in a high voltage range according to embodiments of the present disclosure.

According to aspects of the present disclosure, a circuit having a supply voltage of about 1.8 V can reliably receive signals having a common mode voltage in the range of 0.8 V to 2.5 V. FIG. 1 refers to a scale of I/O signals in a high voltage domain ranging from 0V to 3.6 V. This scale corresponds to the I/O signal scale that is specified for USB 2.0 applications in which the common mode for an I/O signal can vary between 0.8 V and 2.5 V. In an illustrative embodiment, the signal swing of the differential input signal for a USB 2.0 application may be in the range of about 200 mV.

Aspects of the present disclosure divide the signal voltage range of 0.8 V to 2.5 V into two ranges. Signals having a common mode voltage in the first range are reliably received by a ladder circuit, and signals having a common mode voltage in the second range are reliably received by a pass gate circuit. In the example shown in FIG. 1, the ranges are merely exemplary and other values are also contemplated.

The ladder circuit according to an aspect of the present disclosure is described with reference to FIG. 2. The ladder circuit 200 is configured as a differential receiver for receiving a differential input signal. In the differential receiver, node Dp receives a positive portion of the differential input signal and node Dn receives a negative portion of the differential input signal. According to aspects of the present disclosure, nodes Dp and Dn are the input pins in which node Dp is a positive data pin and Dn is a negative data pin for receiving a differential data signal.

In an illustrative embodiment, the ladder circuit 200 is a PMOS ladder coupled to nodes Dp and Dn. The PMOS ladder functions as a high bandwidth voltage divider. At low frequencies the ladder circuit 200 behavior is dominated by the resistances of transistors 202 and each leg of the ladder behaves as a resistive voltage divider. At high frequencies the ladder circuit 200 behaves as a capacitive voltage divider due to the parallel gate to source capacitances of transistors 202 in each leg of the ladder.

The ladder circuitry 200 performs well for signals in the range of twice the gate-source voltage (2*Vgs) of the transistors 202. In this example, the gate-source voltage for each transistor is about 0.6 V, thus, 2*Vgs is about 1.2 V. The ladder circuit 200 can therefore be used to divide an input signal having a common mode of 2.5 V down to a signal having a common mode of 1.2 V so that it can be reliably detected by a 1.8 V receiver. The divided signal from the ladder circuit is coupled to input nodes Lp and Ln of a comparator CMP1.

Figure 3:
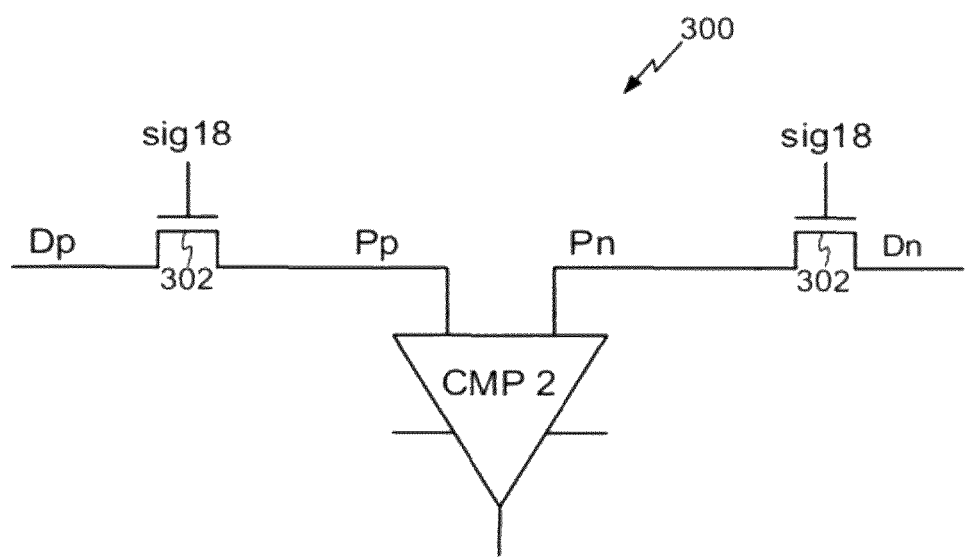
FIG. 3 is a schematic diagram of a pass gate circuit which can be used according to an aspect of the disclosure.

According to aspects of the present disclosure, the ladder circuitry 200 turns off when the common mode voltage of the I/O signal is below 1.2 V. In that case, the signal is received via a pass gate circuit that is coupled in parallel with the ladder circuit. An example of a pass gate circuit which can be used according to an aspect of the disclosure is shown in FIG. 3. The pass gate 300 can transfer signals with common mode voltages up to about 1.8V−Vd which corresponds to about 1.2 V. Output from transistors 302 of the pass gate circuit 300 is coupled to input nodes Pp and Pn of a comparator CMP2.

Figure 2:
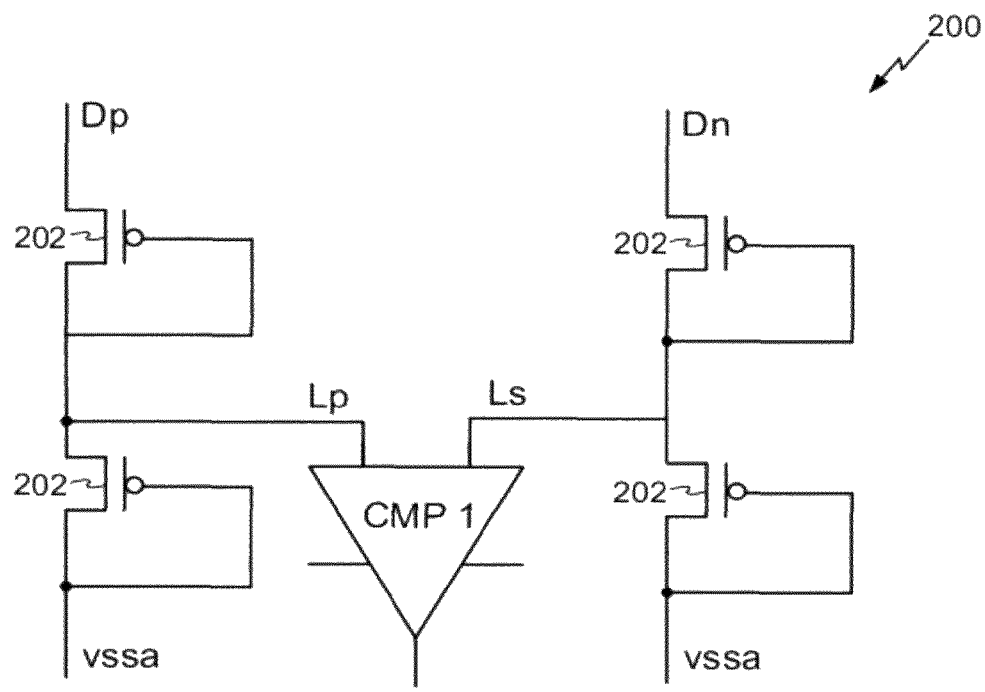
FIG. 2 is a schematic diagram of a ladder circuit according to an aspect of the present disclosure.

According to aspects of the present disclosure, the ladder circuit 200 shown in FIG. 2 is coupled to nodes Dp and Dn in parallel with the pass gate circuit 300 shown in FIG. 3. Differential data signals received on nodes Dp and Dn with a common mode voltage between 2.5 V and 1.2 V are received using the ladder circuit 200 shown in FIG. 2, and signals having a common mode voltage between 0.8 V and 1.2 volts are received using the pass gate circuit 300 shown in FIG. 3.

According to aspects of the present disclosure, transistors 202 of the ladder circuit 200 are highly resistive to prevent excessive current drain through the ladder circuitry from nodes Dp and Dn to node vssa. The physical length of the transistors 202 in an illustrative embodiment of the disclosure is in the order of 10 micro meters to provide high resistance. Because of the high resistance of the transistors 202, the worst case input impedance looking from nodes Dp and Dn is about 620 K ohms. This results in a current drain of only about 0.5 micro amps. This current drain is acceptable for applications such as USB 2.0 applications. Gate to source capacitance of the transistors 202 provide a capacitive coupling through the transistors. Therefore bandwidth is not significantly reduced by the use of transistors 202 with high resistance according to aspects of the disclosure.

Figure 4:
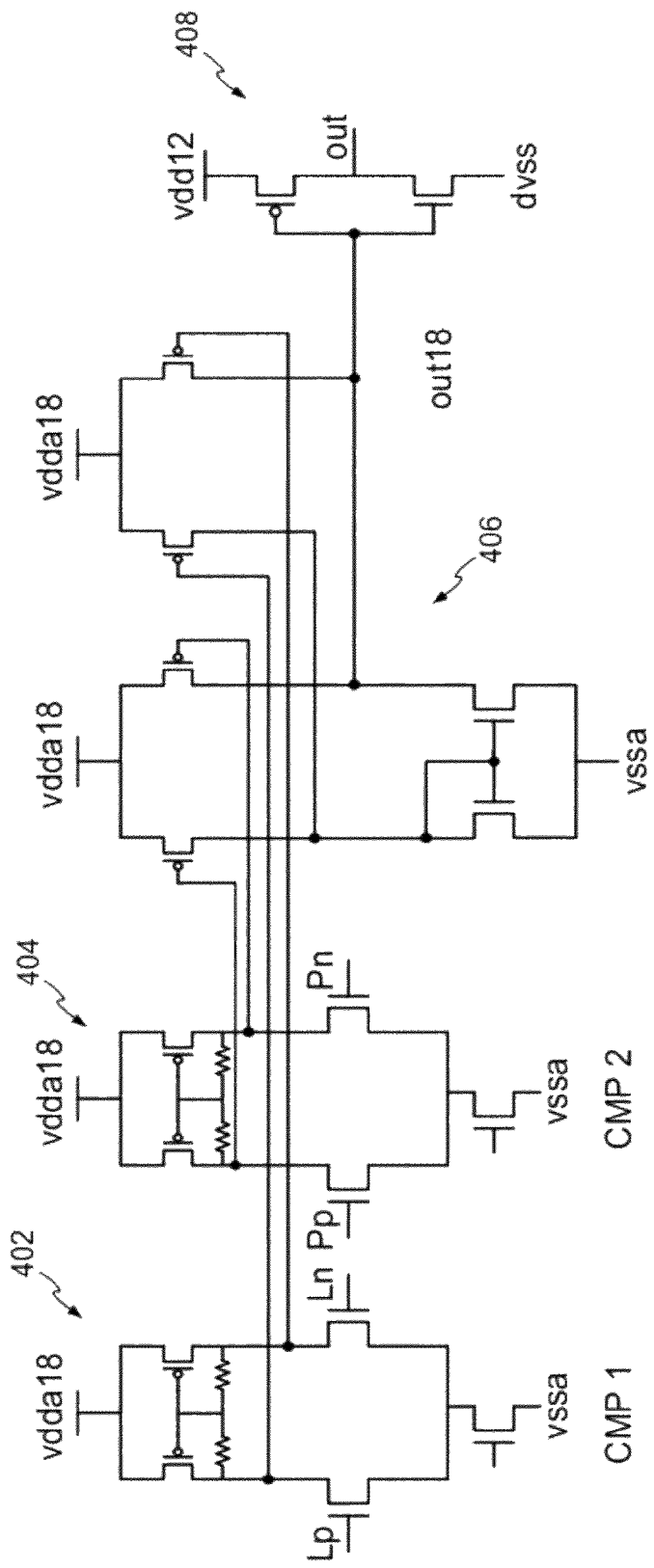
FIG. 4 shows is a schematic diagram of internal components of comparator portion according to embodiments of the present disclosure.

FIG. 4 shows exemplary internal components of the comparator CMP1 402 and the comparator CMP2 404. In the illustrative embodiments, the comparator CMP1 402 and the comparator CMP2 404 are operational transconductance amplifier (OTA) differential receivers. According to aspects of the present disclosure, the output signals of the comparator CMP1 402 and the comparator CMP2 404 are summed together in a differential receiver circuit 406. In the illustrative embodiment shown in FIG. 4, output from the differential receiver circuit 406 is coupled to level shift circuitry 408 which level shifts the signal to provide an output signal OUT in the 1.2 V domain. Alternatively, output from the differential receiver 406 circuit may be used directly as an output signal OUT18 in the 1.8 V domain.

Embodiments of the high voltage tolerant differential receiver according to the present disclosure as shown in FIGS. 2-4 can reliably detect small signals in the order of about 100 mV and may be used for USB 2.0 applications in which signals of about 200 mV are specified.

Figure 5:
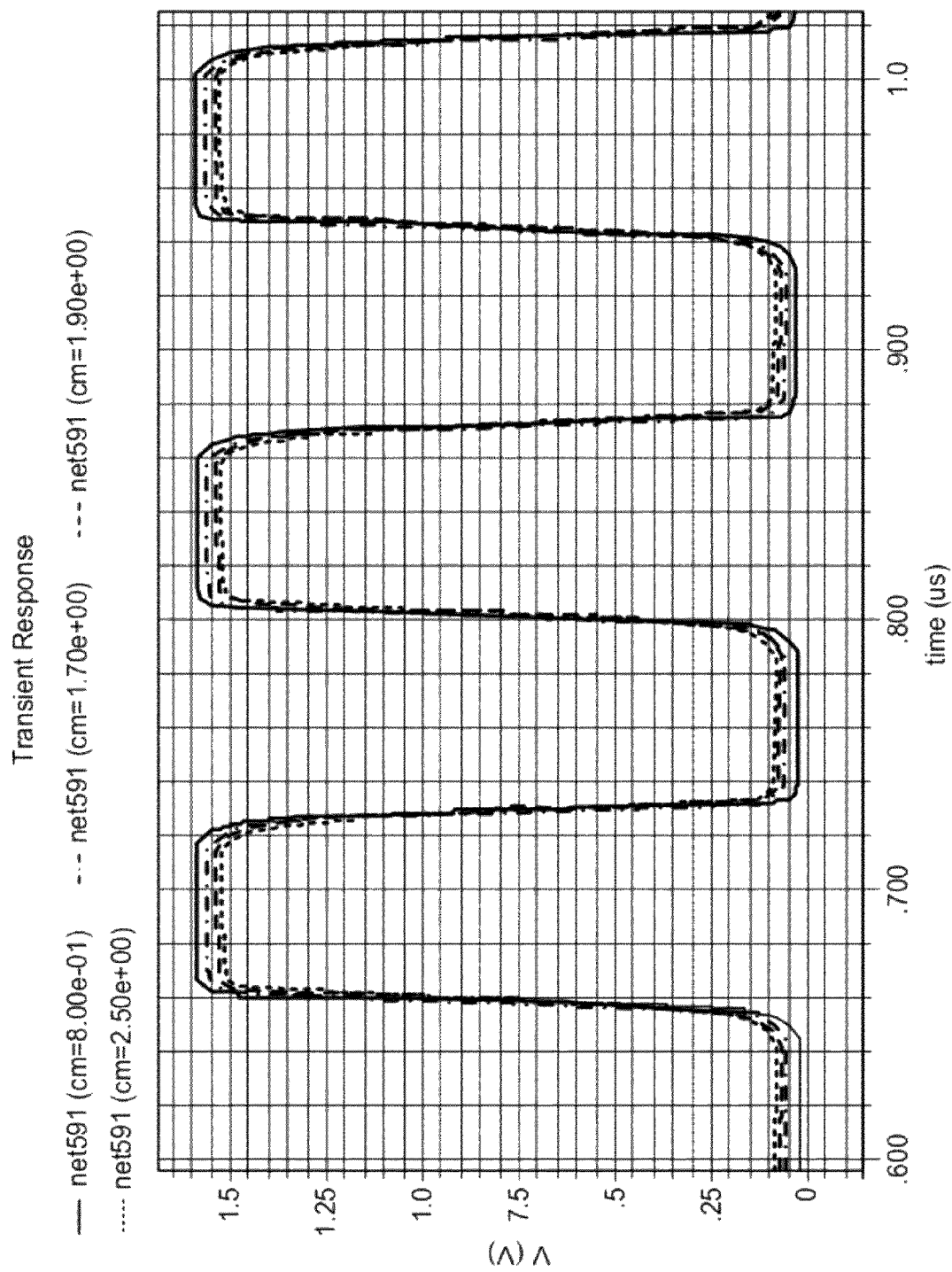
FIG. 5 is a graph showing transient response plots for a high voltage tolerant differential receiver according to an aspect of the present disclosure.

FIG. 5 shows a set of exemplary transient response plots for a high voltage tolerant differential receiver according to an aspect of the present disclosure. Each plot represents output from the differential receiver circuit 406 that is shown in FIG. 4, with no level shifting, in response to a 160 mV differential input signal. The common mode voltage level of the differential input signal is different for each of the four plots shown in FIG. 5. In particular, the plots show transient response of differential input signals having a common mode level of 0.8 V, 1.7 V, 1.9 V and 2.5 V. The transient response shows that the differential receiver circuit 406 can provide a full scale output in the voltage domain of the differential receiver circuit 406 for each of the common mode domains of the input signals.

Figure 6:
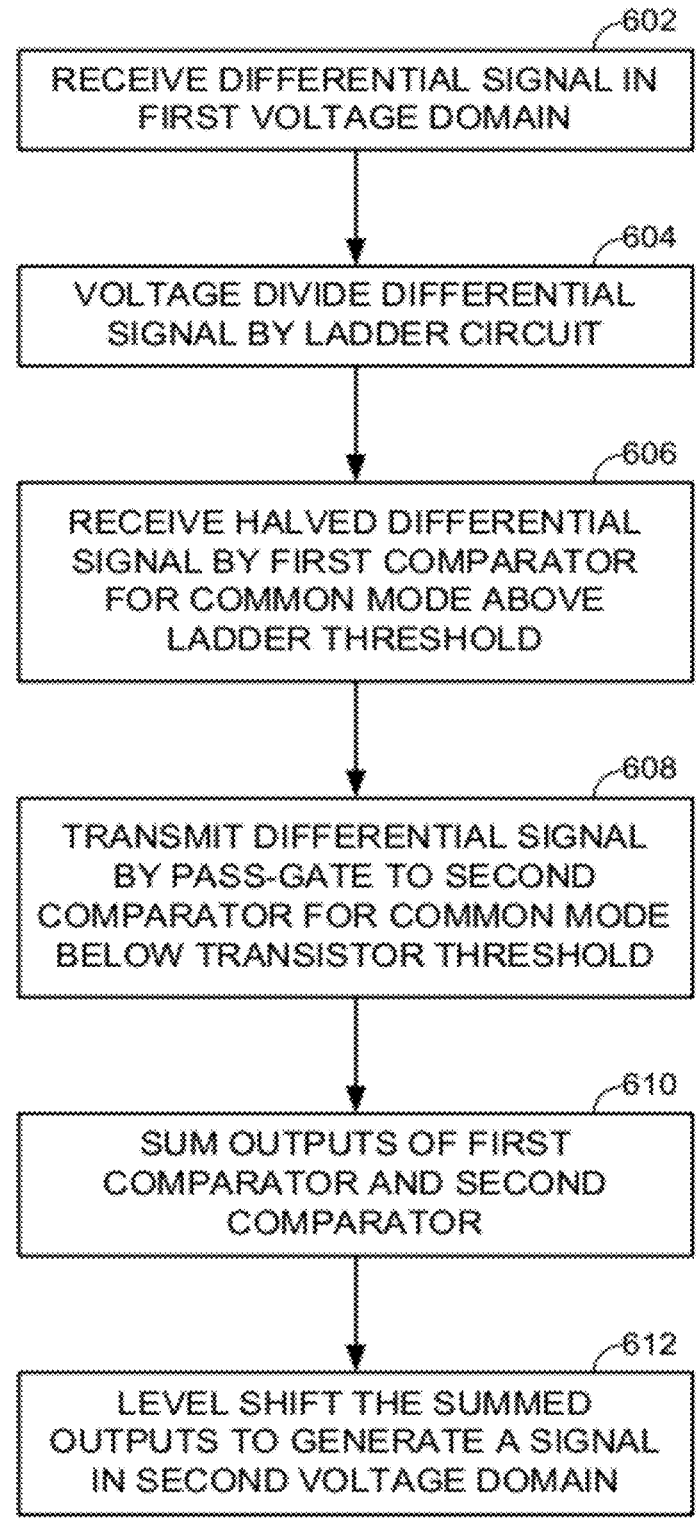
FIG. 6 is a process flow diagram of a method for receiving differential signals in a first voltage domain by a receiver operating in a second voltage domain according to an aspect of the present disclosure.

A method for receiving differential signals in a first voltage domain by a receiver operating in a second voltage domain according to an aspect of the present disclosure is described with reference to FIG. 6. In block 602 a differential signal in a first signal domain is received. The differential signal including a common mode component and a differential component. In block 604, the differential signal is divided by a ladder circuit to generate a halved differential signal when the common mode component is above a threshold of the ladder circuit. According to aspects of the present disclosure the ladder circuit may implemented as an NMOS transistor ladder or a PMOS transistor ladder, for example. In alternative embodiments, a voltage divider ladder implemented with resistors may be used in place of the transistor ladder, for example.

In block 606, the halved differential signal is received by a first comparator when the common mode component is above a threshold of the ladder circuit. In block 608, the differential signal is transmitted by a pass gate to a second comparator when the common mode component is below the threshold of the ladder circuit.

In block 610, output currents from the first comparator and the second comparator are summed together to generate a summed comparator output. In block 612, the summed comparator output is level shifted to generate a signal in a second signal domain.

In an illustrative embodiment, the pass gate may be referenced to a voltage about equal to the threshold of the transistor ladder for enabling the pass gate when the common mode component is below the threshold of the transistor ladder.

The transistor ladder may be configured to operate when the common mode component of the differential input signal is between about 2.5 volts and about 1.2 volts, and the pass gate may be configured to operate when the common mode component of the differential input signal is between about 0.8 volts and about 1.2 volts, for example.

According to another aspect of the present disclosure, a circuit having a supply voltage of about 1.8 V can reliably receive single ended signals having a full swing voltage range from 0 V to 3.6 V. Such single ended signals may be used in USB 2.0 applications, for example. In USB 2.0 applications, a low voltage threshold (Vil) for receiving single ended signals is 0.8 V and a high voltage threshold (Vih) for receiving single end signals is 2.0 V. Previous circuits having a supply voltage of 1.8 V could not meet the 2.0 V high voltage threshold of USB 2.0 applications.

Figure 7A:
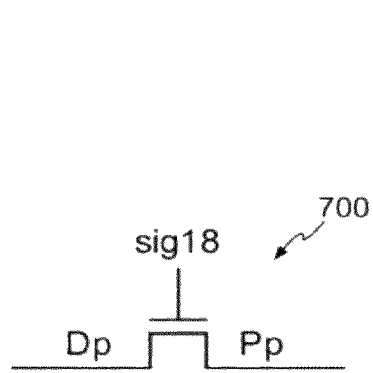
FIG. 7a is a schematic diagram showing a pass gate for receiving single ended signals according to an illustrative embodiment of the disclosure.

FIG. 7a shows a pass gate 700 for receiving single ended signals according to an illustrative embodiment of the disclosure. The pass gate 700 receives a single ended input signal on node Dp and outputs the signal on node Pp.

Figure 7B:
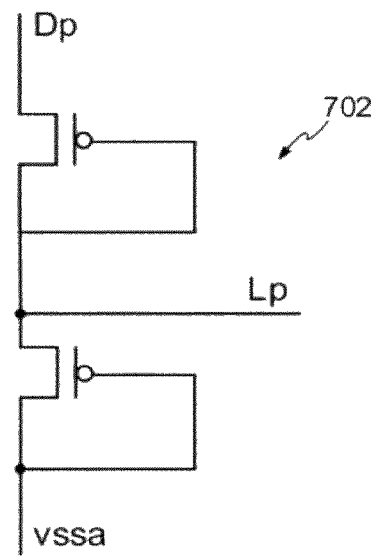
FIG. 7b is a schematic diagram showing a ladder circuit for receiving single ended signals according to an illustrative embodiment of the disclosure.

FIG. 7b shows a ladder circuit 702 for receiving single ended signals according to an illustrative embodiment of the disclosure. The ladder circuit 702 receives a single ended input signal on node Dp and outputs a voltage divided signal on node Lp with half the voltage of the input signal.

Figure 8:
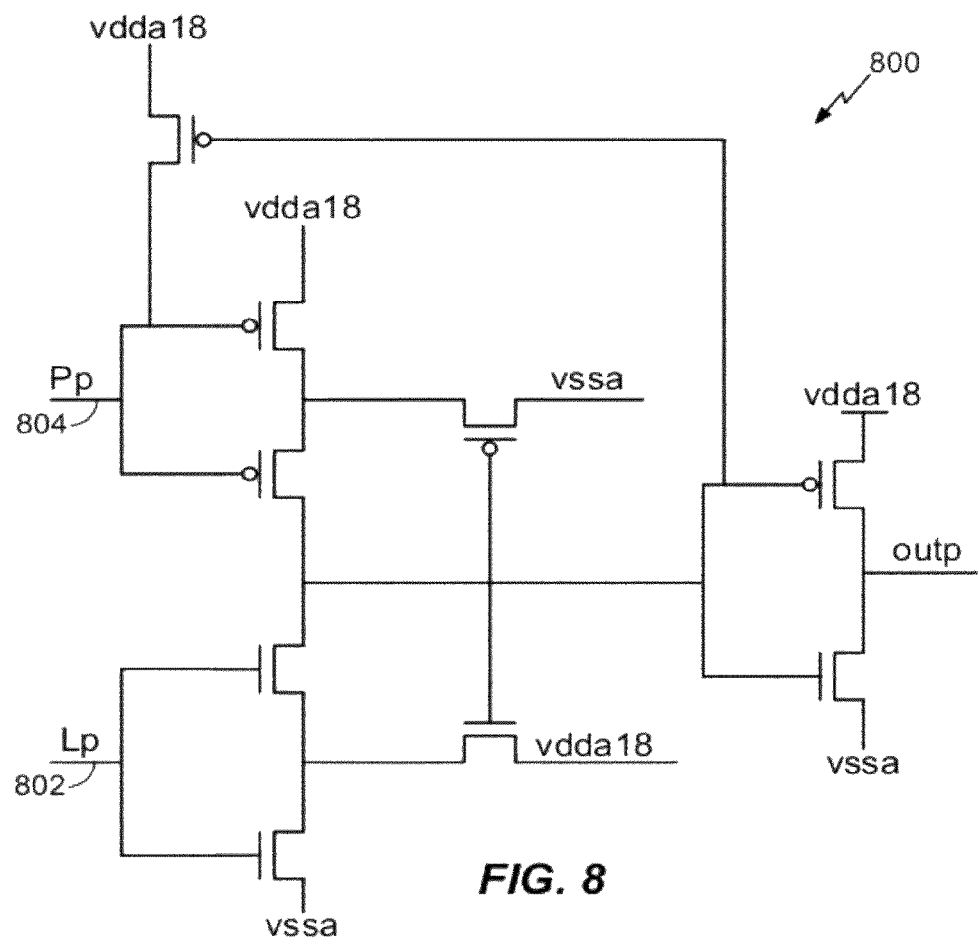
FIG. 8 is a schematic diagram showing coupling of node Pp and node Lp to a modified Schmitt trigger circuit according to aspects of the present disclosure.

According to aspects of the disclosure, the outputs Pp, Lp of the pass gate 700 and the ladder circuit 702, respectively, are input to a modified Schmitt trigger circuit 800, shown in FIG. 8. Node Lp of the ladder circuit 702 shown in FIG. 7b is coupled to one input of the Schmitt trigger circuit 800. Node Pp of the pass gate 700 shown in FIG. 7a is coupled to the other input of the Schmitt trigger circuit 800. FIG. 8 shows coupling of node Pp and node Lp to the modified Schmitt trigger circuit 800 according to aspects of the present disclosure.

When the input signal to the Schmitt trigger circuit 800 transitions from low to high it is desirable to for the Schmitt trigger circuit 800 to switch at the high threshold voltage Vih, which is 2 V in the USB 2.0 example. When the input signal to the Schmitt trigger circuit 800 transitions from high to low, it is desirable for the Schmitt trigger circuit 800 to switch at the low threshold voltage Vil, which is 0.8 V in the USB 2.0 example. The modified Schmitt trigger circuit 800 which is coupled to the ladder circuit 702 shown in FIG. 7b and the pass gate 700 shown in FIG. 7a according to aspects of the present disclosure performs switching at the desired thresholds in response to the transition of the single ended input signal.

The ladder divided output is coupled to node Lp 802 which is the portion of the Schmitt trigger circuit 800 which implements the high threshold voltage Vih. As a result, when the single ended input signal transitions from low to high, the voltage threshold at which the Schmitt trigger circuit 800 will switch depends on the output of the ladder circuit 702 which is half of the voltage of the input signal. In the illustrative embodiment, the high threshold voltage Vih of the Schmitt trigger is set to 1.0 V to account for the voltage divided output of the ladder circuit and to implement an effective Vih of 2.0V relative to the input signal.

The pass gate output is provided at node Pp 804 which is the portion of the Schmitt trigger circuit 800 which implements the low threshold voltage Vin. When the signal goes from high to low, the pass gate 700 is fully operational. As a result, when the single ended input signal transitions from high to low, the voltage threshold at which the Schmitt trigger circuit 800 will switch depends on the output of the pass gate 700 which is the same voltage as the input signal.

Figure 9:
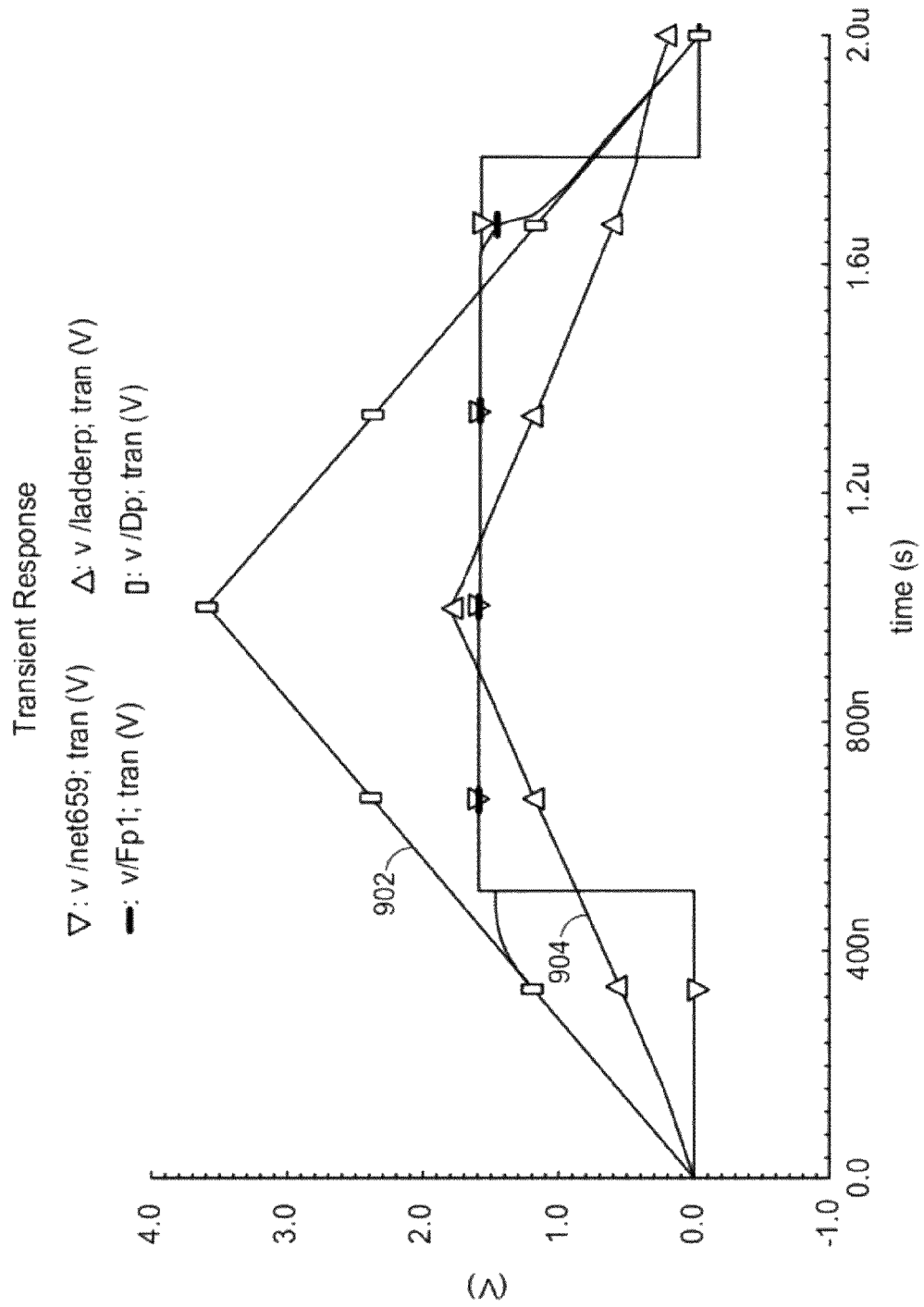
FIG. 9 is a graph showing a response of a Schmitt trigger circuit coupled to a pass gate and ladder circuit according to an illustrative embodiment of the disclosure.

FIG. 9 shows an exemplary response of the Schmitt trigger circuit 800 shown in FIG. 8 coupled to the pass gate 700 shown in FIG. 7a and the ladder circuit 702 shown in FIG. 7b according to an illustrative embodiment of the disclosure. The input signal 902 corresponds to the signal at node Pp of the Schmitt trigger circuit 800. The halved input signal 904 corresponds to the signal at node Lp of the Schmitt trigger circuit 800. As the input signal 904 rises from low to high, the Schmitt trigger circuit 800 switches its output from low to high when the halved input signal 904 crosses a 1.0 V Vih threshold. This enables the Schmitt trigger circuit 800 having a 1.8 V supply to receive higher voltage input signals with an effective Vih of 2.0 V relative to the input signal as specified for USB 2.0 applications.

As the input signal 902 declines from high to low, the Schmitt trigger circuit 800 switches its output from high to low when the full input signal received from the pass gate 700 crosses a 0.8 V Vil threshold. The low voltage threshold is referenced to the full input signal from the pass gate 700 rather than referencing the halved ladder output signal Lp to a 0.4 V threshold, for example, because the ladder circuit 702 may not be suitable for transmitting the halved signal Lp at voltages below about 1.2 volts.

Figure 11:
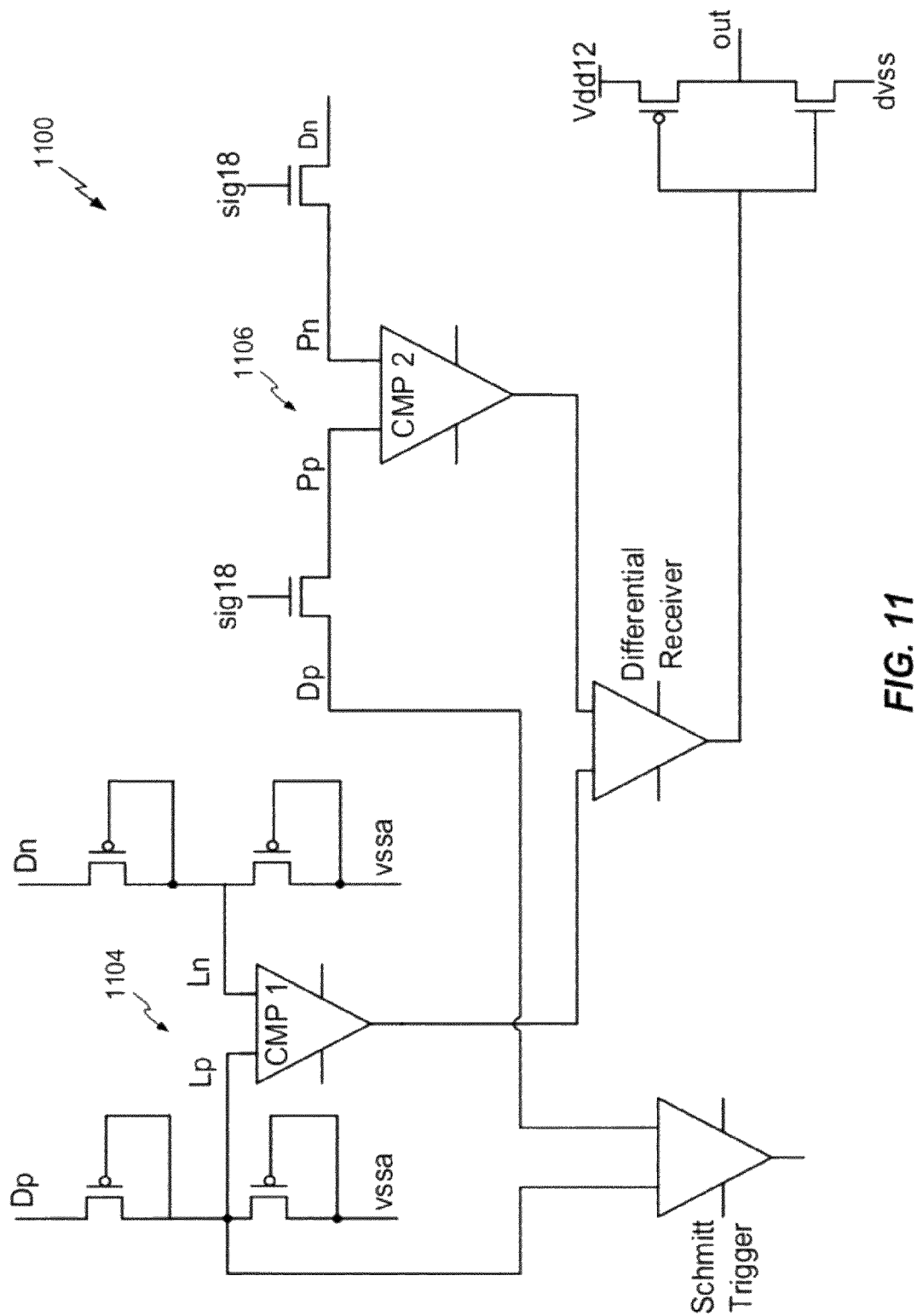
FIG. 11 is a schematic diagram showing a high voltage tolerant differential receiver circuit according to an illustrative embodiment of the present disclosure.

According to another aspect of the present disclosure, a high voltage tolerant differential receiver and a high voltage tolerant single ended receiver are provided in a single circuit. FIG. 11 shows a high voltage tolerant differential receiver circuit 1100 that operates in response to a differential input signal in the manner described above with reference to FIGS. 2-4. A Schmitt trigger 1102 is connected to node Lp of the ladder circuit 1104 and to node Pp of the pass gate 1106. The Schmitt trigger 1102 in combination with the ladder circuit 1104 and pass gate 1106 operate as a single ended receiver in the same manner as the circuit described above with reference to FIGS. 6-8.

Figure 10:
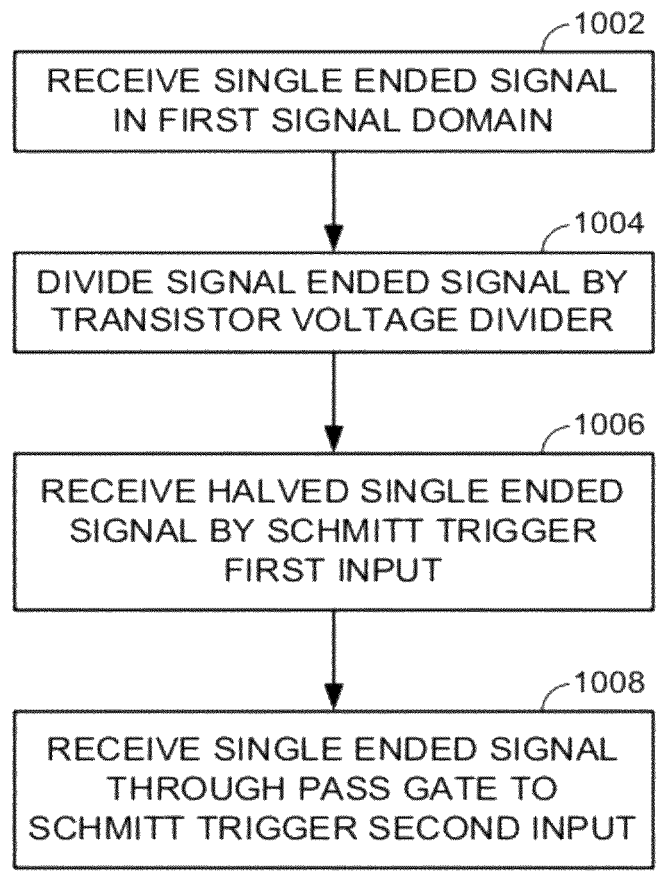
FIG. 10 is a process flow diagram of a method for receiving single ended signals in a first voltage domain by a receiver operating in a second voltage domain according to an aspect of the present disclosure.

A method for receiving single ended signals in a first voltage domain by a receiver operating in a second voltage domain according to an aspect of the present disclosure is described with reference to FIG. 10. In block 1002 a single ended signal is received in a first signal domain. In block 1004, the single ended signal is divided by a voltage divider to generate a halved single ended signal. In block 1006, the halved single ended signal is received by a first input of a Schmitt trigger circuit. The first input of the Schmitt trigger circuit controls a high threshold of the Schmitt trigger circuit. In block 1008, the single ended signal is received through a pass gate to a second input of the Schmitt trigger circuit. The second input controls a low threshold of the Schmitt trigger circuit.

In an illustrative embodiment, the pass gate may be referenced to a voltage about equal to the threshold of the voltage divider for enabling the pass gate when the single ended signal is below the threshold of the transistor voltage divider. The voltage divider may be configured to operate when the single ended input signal is above about 1.2 volts, and the pass gate may be configured to operate when the common mode component of the differential input signal is below about 1.2 volts, for example. In one embodiment, the voltage divider is a transistor, either PMOS or NMOS. In another embodiment, the voltage divider is a resistor divider.

Figure 12:
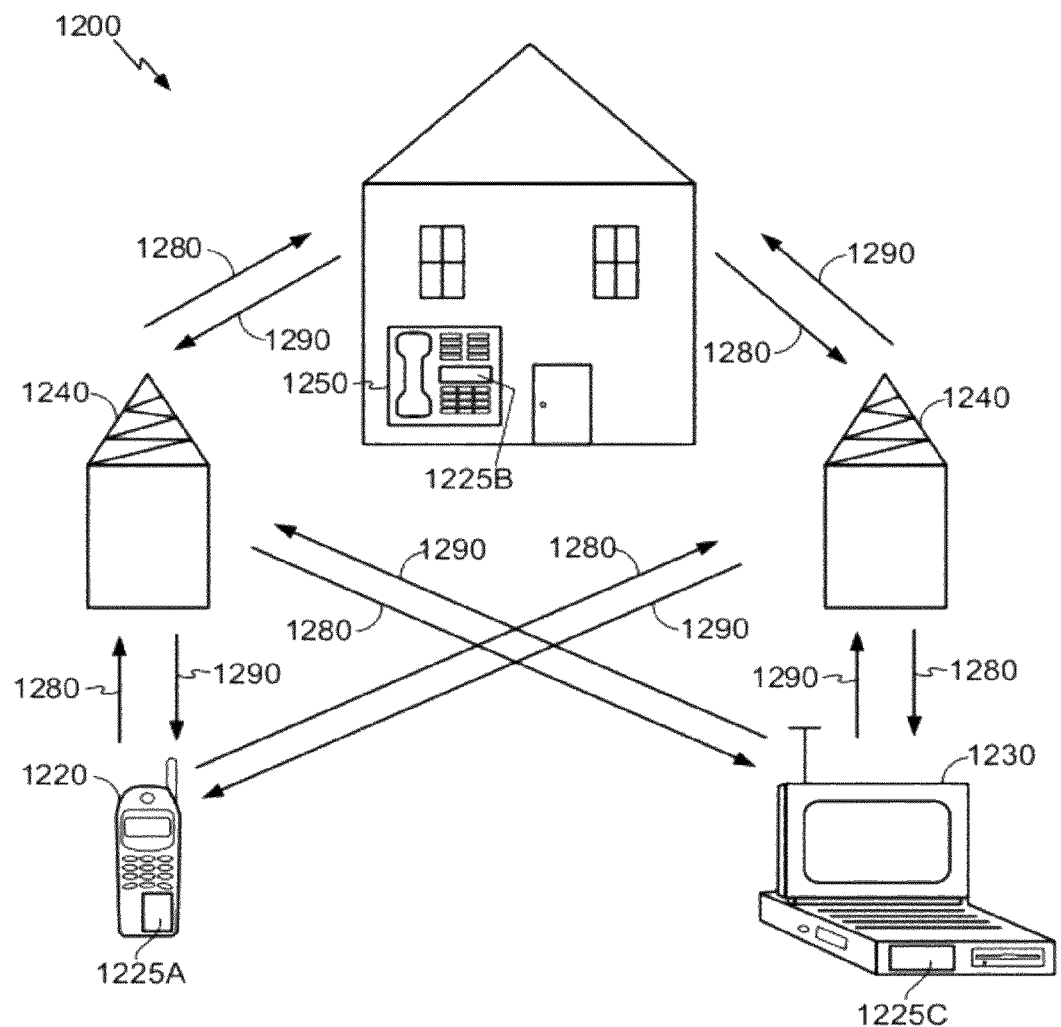
FIG. 12 is a block diagram showing an exemplary wireless communication system in which an embodiment of the disclosure may be advantageously employed.

FIG. 12 is a block diagram showing an exemplary wireless communication system 1200 in which an embodiment of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C and 1225B, that include the disclosed circuitry. It will be recognized that any device containing an IC may also include the circuitry disclosed here, including the base stations, switching devices, and network equipment. FIG. 12 shows forward link signals 1280 from the base station 1240 to the remote units 1220, 1230, and 1250 and reverse link signals 1290 from the remote units 1220, 1230, and 1250 to base stations 1240.

In FIG. 12, remote unit 1220 is shown as a mobile telephone, remote unit 1230 is shown as a portable computer, and remote unit 1250 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 12 illustrates remote units according to the teachings of the disclosure, the disclosure is not limited to these exemplary illustrated units. Embodiments of the disclosure may be suitably employed in any device which includes integrated circuits (ICs).

Figure 13:
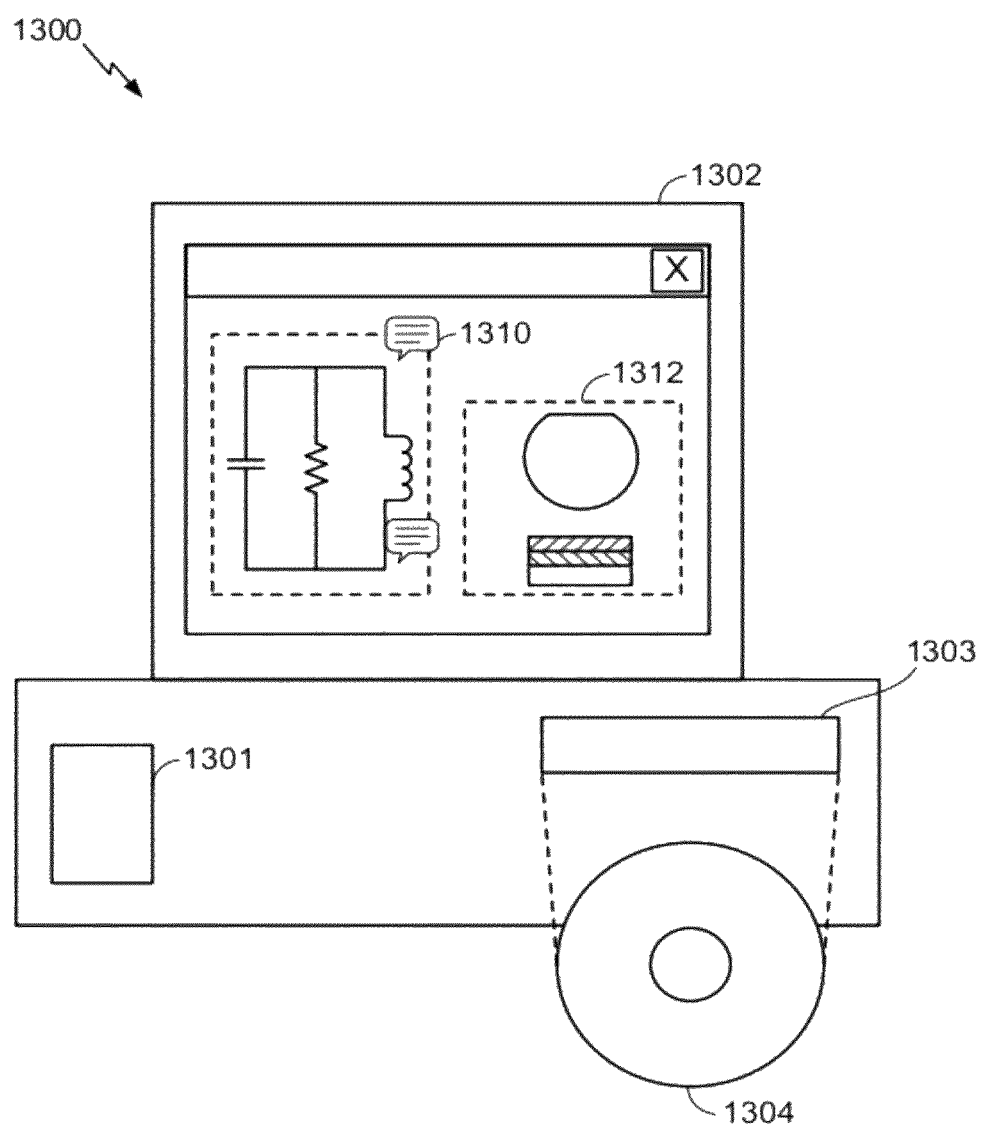
FIG. 13 is a block diagram illustrating a design workstation used for circuit, layout, and logic design of a semiconductor component, such as a high voltage tolerant differential receiver circuitry according to the aspects of the present disclosure.

FIG. 13 is a block diagram illustrating a design workstation used for circuit, layout, and logic design of a semiconductor component, such as high voltage tolerant differential receiver circuitry disclosed above. A design workstation 1300 includes a hard disk 1301 containing operating system software, support files, and design software such as Cadence or OrCAD. The design workstation 1300 also includes a display to facilitate design of a circuit 1310 or a semiconductor component 1312 such as an integrated circuit having high voltage tolerant differential receiver circuitry. A storage medium 1304 is provided for tangibly storing the circuit design 1310 or the semiconductor component 1312. The circuit design 1310 or the semiconductor component 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit design 1310 or the semiconductor component 1312 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

In one configuration, an apparatus configured as a high voltage tolerant receiver includes means for receiving a single ended signal in a first signal domain, means for dividing the single ended signal by a transistor voltage divider to generate a halved single ended signal and means for receiving the halved single ended signal by a first input of a Schmitt trigger circuit, in which the first input controls a high threshold of the Schmitt trigger circuit. The apparatus also includes means for receiving the single ended signal through a pass gate to a second input of the Schmitt trigger circuit, the second input controlling a low threshold of the Schmitt trigger circuit. In one aspect, the aforementioned means may be the processor(s) and memory configured to perform the functions recited by the aforementioned means. In another aspect, the aforementioned means may be a module or any apparatus configured to perform the functions recited by the aforementioned means.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
receiving a single ended signal in a first signal domain;
dividing the single ended signal by a voltage divider to generate a halved single ended signal;
receiving the halved single ended signal by a first input of a Schmitt trigger circuit, the first input controlling a high threshold of the Schmitt trigger circuit; and
receiving the single ended signal through a pass gate to a second input of the Schmitt trigger circuit, the second input controlling a low threshold of the Schmitt trigger circuit.

2. The method of claim 1, comprising:
transmitting the halved single ended signal from the voltage divider to the first input of the Schmitt trigger circuit when the single ended signal is above a threshold of the voltage divider; and
transmitting the single ended signal from the pass gate to the second input of the Schmitt trigger circuit when the single ended signal is below a threshold of the voltage divider.

3. The method of claim 2, comprising:
referencing the pass gate to a voltage about equal to the threshold of the voltage divider for enabling the pass gate when the single ended signal is below the threshold of the voltage divider.

4. The method of claim 2, in which the voltage divider is configured to operate when the single ended signal is above about 1.2 volts, and in which the pass gate is configured to operate when a common mode component of the single ended signal is below about 1.2 volts.

5. The method of claim 1, further comprising performing the receiving the single ended signal in the first signal domain, dividing, receiving the halved single ended signal, and receiving the single ended signal through the pass gate in at least one of a mobile phone, a set top box, a music player, a video player, an entertainment unit, a navigation device, a computer, a hand-held personal communication systems (PCS) unit, a portable data unit, and a fixed location data unit.

6. A circuit comprising:
a Schmitt trigger circuit having a first input for deciding a high threshold and a second input for deciding a low threshold;
a voltage divider circuit coupled to the first input; and
a pass gate circuit coupled to the second input.

7. The circuit of claim 6, in which the voltage divider circuit and the pass gate circuit each receive a single ended signal in a first signal domain, the voltage divider circuit dividing the single ended signal to generate a halved single ended signal;
the first input of the Schmitt trigger circuit receiving the halved single ended signal.

8. The circuit of claim 7, in which the voltage divider circuit is configured to transmit the halved single ended signal to the first input of the Schmitt trigger circuit when the single ended signal is above a threshold of the voltage divider circuit; and
in which the pass gate circuit is configured to transmit the single ended signal to the second input of the Schmitt trigger circuit when the single ended signal is below a threshold of the voltage divider circuit.

9. The circuit of claim 8, in which the pass gate circuit is referenced to a voltage about equal to the threshold of the voltage divider circuit for enabling the pass gate circuit when the single ended signal is below the threshold of the voltage divider circuit.

10. The circuit of claim 8, in which the voltage divider circuit is configured to operate when the single ended signal is above about 1.2 volts, and in which the pass gate circuit is configured to operate when a common mode component of the single ended signal is below about 1.2 volts.

11. The circuit of claim 6, integrated into at least one of a mobile phone, a set top box, a music player, a video player, an entertainment unit, a navigation device, a computer, a hand-held personal communication systems (PCS) unit, a portable data unit, and a fixed location data unit.

12. A system, comprising:
means for receiving a single ended signal in a first signal domain;
means for dividing the single ended signal to generate a halved single ended signal;
means for receiving the halved single ended signal to control a high threshold of the halved single ended signal receiving means; and
means for receiving the single ended signal to control a low threshold of the single ended signal receiving means.

13. The system of claim 12, further comprising:
means for transmitting the halved single ended signal from the dividing means to the halved single ended signal receiving means when the single ended signal is above a threshold of the dividing means; and
means for transmitting the single ended signal to the single ended signal receiving means when the single ended signal is below a threshold of the dividing means.

14. The system of claim 13, further comprising:
means for referencing the single ended signal receiving means to a voltage about equal to the threshold of the dividing means for enabling the single ended signal receiving means when the single ended signal is below the threshold of the dividing means.

15. The system of claim 12, integrated into at least one of a mobile phone, a set top box, a music player, a video player, an entertainment unit, a navigation device, a computer, a hand-held personal communication systems (PCS) unit, a portable data unit, and a fixed location data unit.

16. A method comprising the steps of:
receiving a single ended signal in a first signal domain;
dividing the single ended signal by a voltage divider to generate a halved single ended signal;
receiving the halved single ended signal by a first input of a Schmitt trigger circuit, the first input controlling a high threshold of the Schmitt trigger circuit; and
receiving the single ended signal through a pass gate to a second input of the Schmitt trigger circuit, the second input controlling a low threshold of the Schmitt trigger circuit.

17. The method of claim 16, comprising the steps of:
transmitting the halved single ended signal from the voltage divider to the first input of the Schmitt trigger circuit when the single ended signal is above a threshold of the voltage divider; and
transmitting the single ended signal from the pass gate to the second input of the Schmitt trigger circuit when the single ended signal is below a threshold of the voltage divider.

18. The method of claim 16, comprising the steps of:
referencing the pass gate to a voltage about equal to the threshold of the voltage divider for enabling the pass gate when the single ended signal is below the threshold of the voltage divider.

19. The method of claim 16, further comprising performing the receiving a single ended signal in a first signal domain step, dividing step, receiving the halved single ended signal step and receiving the single ended signal through a pass gate step in at least one of a mobile phone, a set top box, a music player, a video player, an entertainment unit, a navigation device, a computer, a hand-held personal communication systems (PCS) unit, a portable data unit, and a fixed location data unit.

* * * * *